_(12)_ United States Patent
Bakker

(10) Patent No.: US 7,911,226 B2
(45) Date of Patent: *Mar. 22, 2011

(54) POWER-UP AND POWER-DOWN CIRCUIT FOR SYSTEM-ON-A-CHIP INTEGRATED CIRCUIT

(75) Inventor: Gregory Bakker, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 1244 days.

This patent is subject to a terminal disclaimer.

(21) Appl. No.: 11/467,279

(22) Filed: Aug. 25, 2006

(65) Prior Publication Data

US 2006/0284324 A1    Dec. 21, 2006

Related U.S. Application Data

(63) Continuation of application No. 11/021,092, filed on Dec. 22, 2004, now Pat. No. 7,119,398.

(51) Int. Cl.
*H03K 19/173*    (2006.01)
*G05F 1/00*    (2006.01)
*G05F 5/00*    (2006.01)

(52) U.S. Cl. ............... 326/37; 326/38; 326/39; 323/313

(58) Field of Classification Search .................... 307/11, 307/32, 33, 34, 35, 42, 43, 71, 77, 80, 85; 323/313, 314, 315, 316, 317; 326/37, 38, 326/39, 101, 102, 103; 327/539, 540; 257/335, 257/368, 499, 779, 780, 782, 784, E27.001

See application file for complete search history.

(56) References Cited

U.S. PATENT DOCUMENTS

| | | |
|---|---|---|
| 4,165,642 A | 8/1979 | Lipp |
| 4,503,494 A | 3/1985 | Hamilton et al. |
| 4,758,745 A | 7/1988 | Elgamal et al. |
| 4,855,954 A | 8/1989 | Turner et al. |
| 4,870,302 A | 9/1989 | Freeman |
| 4,879,688 A | 11/1989 | Turner et al. |
| 5,101,122 A | 3/1992 | Shinonara |
| 5,132,571 A | 7/1992 | McCollum et al. |
| 5,237,218 A | 8/1993 | Josephson et al. |
| 5,237,699 A | 8/1993 | Little et al. |

(Continued)

OTHER PUBLICATIONS

Author: Anonymous, 4-Pin μP Voltage Monitors with Manual Reset Input, Maxim Integrated Products, document 19-0411; Rev 3; 3/99, pp. 1-8, Mar. 1999.

(Continued)

*Primary Examiner* — Lynne A Gurley
*Assistant Examiner* — Andrew O. Arena
(74) *Attorney, Agent, or Firm* — Lewis and Roca LLP

(57) ABSTRACT

A power-up and power-down circuit for an integrated circuit includes a voltage regulator set for a first voltage. A first I/O pad is coupled internally to an input to the voltage regulator and to first internal circuits. The second voltage is externally coupled to the first I/O pad. A second I/O pad is coupled internally to an output of the voltage regulator configured to drive the base of an external transistor. A third I/O pad of the integrated circuit is coupled internally to a reference-voltage input of the voltage regulator. A fourth I/O pad is coupled to a feedback input of the voltage regulator. A fifth I/O pad of the integrated circuit is coupled internally to logic circuitry that controls power-up and power down of the integrated circuit from internal signals including internal signals from a real-time clock circuit disposed on the integrated circuit.

6 Claims, 1 Drawing Sheet

U.S. PATENT DOCUMENTS

Figure 1:
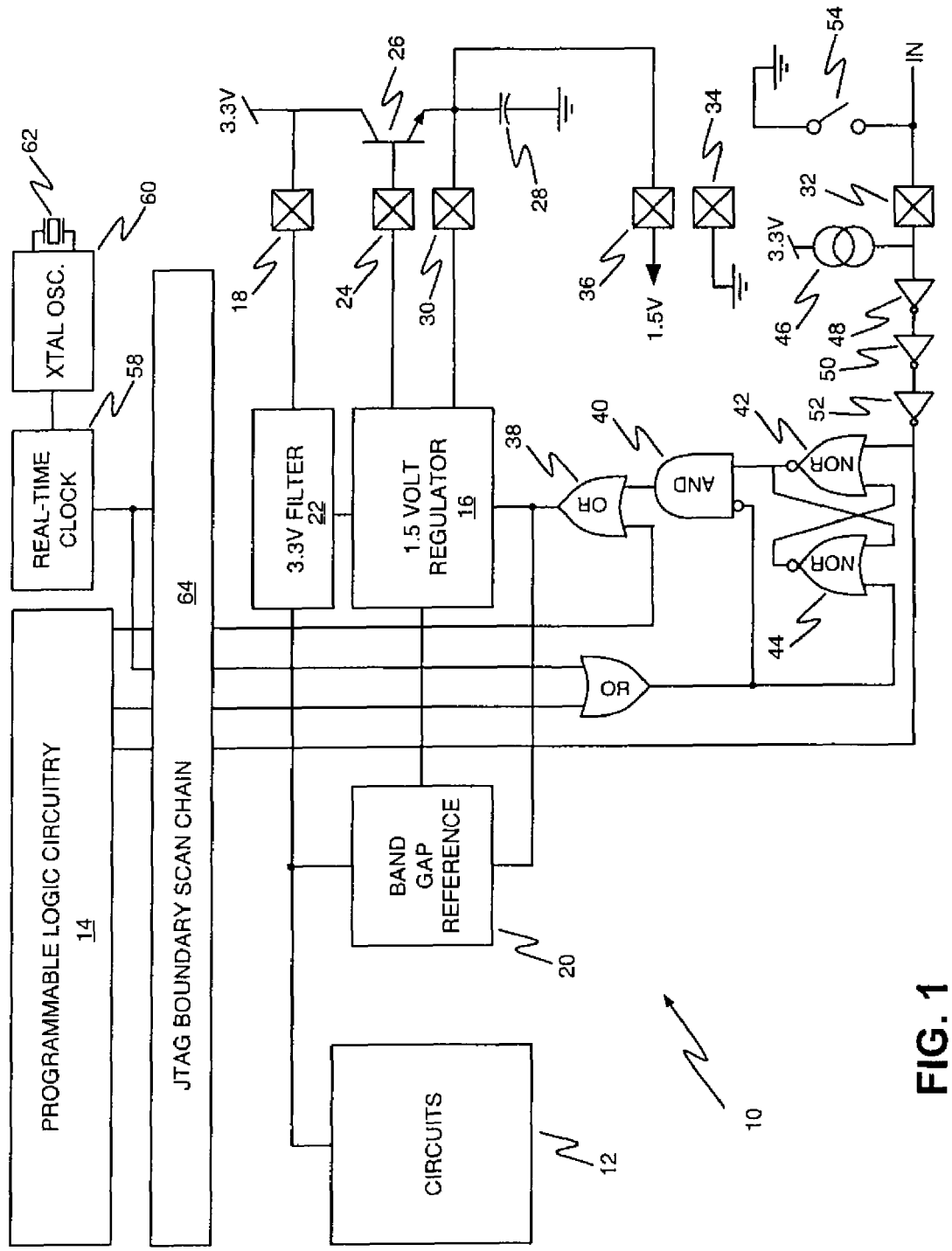

| | | | |
|---|---|---|---|
| 5,336,951 | A | 8/1994 | Josephson et al. |
| 5,451,912 | A | 9/1995 | Torode |
| 5,559,449 | A | 9/1996 | Padoan et al. |
| 5,563,526 | A | 10/1996 | Hastings et al. |
| 5,684,434 | A | 11/1997 | Mann et al. |
| 5,687,065 | A | 11/1997 | Majid |
| 5,687,325 | A | 11/1997 | Chang |
| 5,811,987 | A | 9/1998 | Ashmore, Jr. et al. |
| 5,821,776 | A | 10/1998 | McGowan |
| 5,877,656 | A | 3/1999 | Mann et al. |
| 5,889,701 | A | 3/1999 | Kang et al. |
| 5,949,987 | A | 9/1999 | Curd et al. |
| 5,999,014 | A | 12/1999 | Jacobson et al. |
| 6,034,541 | A | 3/2000 | Kopec, Jr. et al. |
| 6,091,641 | A | 7/2000 | Zink |
| 6,104,257 | A | 8/2000 | Mann |
| 6,134,707 | A | 10/2000 | Herrmann et al. |
| 6,145,020 | A | 11/2000 | Barnett |
| 6,150,837 | A | 11/2000 | Beal et al. |
| 6,191,660 | B1 | 2/2001 | Mar et al. |
| 6,243,842 | B1 | 6/2001 | Slezak et al. |
| 6,260,087 | B1 | 7/2001 | Chang |
| 6,272,646 | B1 | 8/2001 | Rangasayee et al. |
| 6,304,099 | B1 | 10/2001 | Tang et al. |
| 6,334,208 | B1 | 12/2001 | Erickson |
| 6,346,905 | B1 | 2/2002 | Ottini et al. |
| 6,356,107 | B1 | 3/2002 | Tang et al. |
| 6,389,321 | B2 | 5/2002 | Tang et al. |
| 6,396,168 | B2 | 5/2002 | Ghezzi et al. |
| 6,408,432 | B1 | 6/2002 | Herrmann et al. |
| 6,414,368 | B1 | 7/2002 | May et al. |
| 6,415,344 | B1 | 7/2002 | Jones et al. |
| 6,433,645 | B1 | 8/2002 | Mann et al. |
| 6,442,068 | B1 | 8/2002 | Bartoli et al. |
| 6,483,344 | B2 | 11/2002 | Gupta |
| 6,490,714 | B1 | 12/2002 | Kurniawan et al. |
| 6,515,551 | B1 | 2/2003 | Mar et al. |
| 6,526,557 | B1 | 2/2003 | Young et al. |
| 6,552,935 | B2 | 4/2003 | Fasoli |
| 6,594,192 | B1 | 7/2003 | McClure |
| 6,600,355 | B1 | 7/2003 | Nguyen |
| 6,614,320 | B1 | 9/2003 | Sullam et al. |
| 6,651,199 | B1 | 11/2003 | Shokouhi |
| 6,674,332 | B1 | 1/2004 | Wunner et al. |
| 6,748,577 | B2 | 6/2004 | Bal |
| 6,753,739 | B1 | 6/2004 | Mar et al. |
| 7,030,649 | B1 | 4/2006 | Balasubramanian et al. |
| 7,119,393 | B1 | 10/2006 | McCollum |
| 2001/0030554 | A1 | 10/2001 | Ghezzi et al. |
| 2002/0007467 | A1 | 1/2002 | Ma et al. |
| 2002/0108006 | A1 | 8/2002 | Snyder |
| 2003/0001614 | A1 | 1/2003 | Singh et al. |
| 2003/0005402 | A1 | 1/2003 | Bal |
| 2003/0074637 | A1 | 4/2003 | Pavesi et al. |
| 2003/0210585 | A1 | 11/2003 | Bernardi et al. |
| 2003/0210599 | A1 | 11/2003 | McClure |
| 2003/0214321 | A1 | 11/2003 | Swami et al. |
| 2004/0008055 | A1 | 1/2004 | Khanna et al. |
| 2004/0036500 | A1 | 2/2004 | Bratt |
| 2005/0200998 | A1 | 9/2005 | Rowan |
| 2005/0237083 | A1 | 10/2005 | Bakker |

OTHER PUBLICATIONS

Author: Anonymous, "Fan Controller and Remote Temperature Sensor with SMBus Serial Interface" for MAX1669, Maxim Integrated Products, document 19-1575; Rev 0; 1/00, pp. 1-8, Jan. 2000.

Author: Anonymous, "Precision RESET Controller and 4K I2C Memory With Both RESET ad RESET Outputs" for S24042/S24043, Summit Microelectronics, Inc., document 2011 2.0 May 2, 2000, pp. 1-14, May 2000.

Author: Anonymous, "SOT23, Low-Power µP Supervisory Circuits with Battery Backup and Chip-Enable Gating" for MAX6365-MAX6368, Maxim Integrated Products, document 19-1658; Rev 1; 6/01, pp. 1-15, Jun. 2001.

Author: Anonymous, "Cypress MicroSystems PsoC Microcontrollers Now Available in Volume", Cypress Semiconductor Corporation Press Release Sep. 5, 2001 [Internet: mhtml:file://D:\Act401\Cypress%20Semiconductor%20Corporation.mht].

Author: Anonymous, "nvSRAM—SRAM and EEPROM within a single chip" ZMD AG, pp. 1-4, Oct. 2001.

Author: Anonymous, "Intelligent Temperature Monitor and Dual PWM Fan Controller" for ADM1031, Analog Devices, pp. 1-32, 2003 (no month).

Author: Anonymous, "LM63 ±1° C./3° C. Accurate Remote Diode Digital Temperature Sensor with Integrated Fan Control", National Semiconductor Corporation, document DS200570, pp. 1-28, 2003 (no month).

Author: Anonymous, "PsoC™ Configurable Mixed-Signal Array with On-board Controller", CY8C25122, CY8C26233, CY8C26443, CY8C26643, Device Data Sheet for Silicon Revision D, Cypress MicroSystems Document #: 38-1201 CY Rev. *B CMS Rev. 3.22, pp. 1-150, Aug. 18, 2003.

Author: Anonymous, "PSoC™ Mixed Signal Array", Preliminary Data Sheet for CY8C29466, CY8C29566, CY8C29666, and CY8C29866, Cypress MicroSystems Document No. 38-12013 Rev. *D., pp. 1-41, Jun. 2004.

POWER-UP AND POWER-DOWN CIRCUIT FOR SYSTEM-ON-A-CHIP INTEGRATED CIRCUIT

CROSS-REFERENCE TO RELATED APPLICATIONS

This application is a continuation of U.S. patent application Ser. No. 11/021,092, filed Dec. 22, 2004, now issued as U.S. Pat. No. 7,119,398.

BACKGROUND OF THE INVENTION

1. Field of the Invention

The present invention relates to integrated circuits. More particularly, the present invention relates to integrated circuits having multiple voltage power supply requirements and to a power-up and power-down circuit for use on such an integrated circuit.

2. The Prior Art

As integrated circuit functions become more complex, the power-supply requirements for the integrated circuits also increase in complexity. For example, an emerging trend is to provide both analog and digital functions on the same integrated circuit die. The power supply requirements for an integrated circuit including both analog and digital functions include provision for more than one voltage to be supplied to the integrated circuit. Typical requirements for such an integrated circuit fabricated according to presently-practiced technology may include the requirement to supply both 1.5 volts and 3.3 volts for circuitry internal to the integrated circuit.

BRIEF DESCRIPTION OF THE INVENTION

A power-up and power-down circuit for use on an integrated circuit includes a voltage regulator set for a first voltage used by circuits in the integrated circuit. A first I/O pad of the integrated circuit is coupled internally to an input to the voltage regulator and to circuits in the integrated circuit that use a second voltage. The second voltage used by the integrated circuit is externally coupled to the first I/O pad. A second I/O pad is coupled internally to an output of the voltage regulator that is configured to drive the base of an external emitter-follower transistor. A third I/O pad of the integrated circuit is coupled internally to a feedback input of the internal voltage regulator. In operation, an external transistor will have its collector coupled to the first I/O pad, its base coupled to the second I/O pad and its emitter coupled to the third I/O pad. An external filter capacitor will be coupled between the emitter of the transistor and ground. A fourth I/O pad of the integrated circuit is coupled internally to logic circuitry that controls power-up and power down of the integrated circuit from internal signals including internal signals from a real-time clock circuit disposed on the integrated circuit. A fifth I/O pad provides the first voltage to internal circuits on the integrated circuit.

BRIEF DESCRIPTION OF THE DRAWING FIGURES

FIG. 1 is a block diagram illustrating the principles of the present invention.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Referring to FIG. 1, an exemplary embodiment of a power-up and power-down circuit according to the present invention is shown. Integrated circuit 10 requires a first power-supply voltage and a second power-supply voltage different from the first power-supply voltage. In the exemplary embodiment discussed with reference to FIG. 1, the first and second power-supply voltages will be 1.5 VDC and 3.3 VDC, respectively, although persons of ordinary skill in the art will appreciate that the present invention is not limited to these particular values and will function with other voltages as well. In the exemplary embodiment of FIG. 1, 3.3 volts is used to drive circuits such as analog circuits 12, and 1.5 volts is used to drive logic circuits 14 such as programmable logic in the form of an FPGA array or similar programmable circuitry.

As may be seen from FIG. 1, a voltage regulator 16 is set to provide the first power supply voltage. The second power supply voltage is provided directly to the integrated circuit on a first I/O pad 18. The second power-supply voltage is coupled to the input of voltage regulator 16. A bandgap circuit 20 provides a reference voltage to a reference input of the voltage regulator 16. Bandgap reference circuit 20, as well as the circuits 12, is powered directly by the second power-supply voltage through a power-supply filter 22 for the second power-supply voltage that is coupled to the first I/O pad 18.

A reference input of voltage regulator 16 is coupled to the output of bandgap reference circuit 20. An output of the voltage regulator circuit 16 is coupled to a second I/O pad 24. The output of the voltage regulator 16 is designed to drive the base of an external NPN transistor, shown at reference numeral 26 connected as an emitter-follower. The collector of external transistor 26 may be coupled to the second power-supply voltage that is supplied to the first I/O pad 18. The emitter of external transistor 26 supplies the regulated first power-supply voltage and is coupled to a filter capacitor 28, the other plate of which is referenced to ground as is known in the art. The second power-supply voltage at the emitter of the external transistor 26 is fed back to voltage regulator 16 via third I/O pad 30 as is known in the art.

Voltage regulator circuit 16 has an enable input that may be controlled from circuits inside integrated circuit 10, such as a real-time clock or programmable logic circuits 14. The enable input to voltage regulator 16 may also be controlled from an external source through fourth I/O pad 32. The regulated voltage from the emitter of transistor 26 is provided to the integrated circuit through a fifth I/O pad 36 through a connection external to the device. As is customary, ground is provided to integrated circuit 10 through a sixth I/O pad 34.

More particularly, in the exemplary embodiment of FIG. 1, the enable input of voltage regulator 16 is driven by OR gate 38. A first input of OR gate 38 is driven by the output of AND gate 40. One input of AND gate 40 is driven from the output of NOR gate 42. NOR gate 42 is cross coupled with NOR gate 44 to form a latch as is known in the art. The other input of NOR gate 42 is controlled from fourth I/O pad 32. In the exemplary embodiment of FIG. 1, a small current source 46 drives a triple low-power inverter string including cascaded inverters 48, 50, and 52. As shown in FIG. 1, inverter 48 may have an input conditioned to reject contact bounce in the event that an external mechanical switch 54 is used to activate the power control function. Switch 54 is preferably a momentary switch, but other switches can be employed. Persons of ordinary skill in the art will appreciate that fourth I/O pad 32 may be driven from either or both of a mechanical switch and a low-going signal from a device external to integrated circuit 10. The output of inverter 52 drives the free input of NOR gate 42.

The free input of NOR gate 44 is coupled to the output of OR gate 56. One input of OR gate 56 is driven by the output of real-time clock 58. Real-time clock 58, and the crystal oscillator 60 that drives it using an external crystal 62 as is known in the art, are driven from the second power-supply voltage at first I/O pad 18. Real-time clock 58, and crystal oscillator 60 are always running so long as the second power-supply voltage is present on first I/O pad 18. The second input of OR gate 56 may be driven from programmable logic circuit 14 if a portion of it is programmed (or hardwired) to provide a power-supply control function.

Boundary-scan register chain 64 may be provided in the circuit of FIG. 1. As will be understood by persons of ordinary skill in the art, boundary-scan register chain 64 may be configured according to the well-known JTAG standard and may be used to load data, perform diagnostic routines, etc. The signal and control lines passing between logic circuitry 14 and the other elements of FIG. 1 may all pass through boundary-scan register chain 64.

Normally, the free inputs of both NOR gates 42 and 44 are held at a logic low level. Initially, the output of NOR gate 42 will be at a logic high level, forcing the output of NOR gate 44 (and the other input of NOR gate 42 which it drives) to be at a logic low level. This can be accomplished by selecting the relative sizing of NOR gates 42 and 44 or by assuring that a logic high level is provided to the free input of NOR gate 44 at power-up of the second power-supply voltage.

The inverting input of AND gate 40 will be at a logic low level and its output will thus be at a logic high level. The second input of OR gate 38 will be at a logic low level and its output will be at a logic high level, disabling voltage regulator 16.

If switch 54 is closed, fourth I/O pad 32 goes to a logic low level, forcing the free input of NOR gate 42 to a high logic level through the output of inverter 52. The output of NOR gate 42 will be forced to a logic low level, driving the output of NOR gate 44 to a logic high level since its other input is also at a logic low level. This will latch the output of NOR gate 42 to the logic low state, enabling voltage regulator 16. Once this occurs, further activation of switch 54 will have no effect on the voltage regulator 16 through NOR gate 42.

As shown in FIG. 1, the output of inverter 52 may also be coupled into the programmable logic circuitry 14 to indicate the state of the switch 54. Programmable logic circuitry 14 may be configured to provide a signal to an input of OR gate 56 to provide a signal to NOR gate 44 to disable voltage regulator 16 once it detects that switch 54 has been closed for a second time.

Control circuits or state machines for implementing particular power-up and power-down control functions may be appropriately implemented in programmable logic circuitry 14. Persons of ordinary skill in the art know how to implement such circuits in programmable logic to provide particular control functions that are simply a matter of design choice and are beyond the scope of the present invention.

Persons of ordinary skill in the art will appreciate that the control gates discussed in the preceding text are powered from first I/O pad 18, to allow immediate control of the power-up and power-down circuit of the present invention.

The power-up and power-down circuit of the present invention is versatile and allows significant control over the first power-supply voltage. In its initial state when the second power-supply voltage is applied to first I/O pad 18, voltage regulator 16 is disabled. A low-going signal from an external source at fourth I/O pad 32 will enable the voltage regulator 16 as previously disclosed herein.

Voltage regulator 16 may be disabled as a result of any one of several events. First, a second low-going signal at fourth I/O pad 32 may be sensed by logic circuitry 14, which can then provide a disable signal through OR gate 56. In addition, logic circuits disposed inside logic circuitry 14 may provide a disable signal through OR gate 56 in response to any number of internal or external conditions being met. The range of possibilities in this regard is vast, being limited only by the requirements of any particular design and the imagination of the application designer. The operation of the present invention is thus not limited to operating in response to any particular internal or external conditions.

Finally, the operation of the power-up and power-down circuit of the present invention may be controlled by real-time clock 58 through the other input of OR gate 56. Persons of ordinary skill in the art will recognize that voltage regulator 16 may be both enabled and disabled when the output of OR gate 56 is controlled by real-time clock 58. As will be appreciated by persons of ordinary skill in the art, real-time clock 58 may be programmed to issue "sleep" or "wake-up" signals at preselected intervals and may provide a logic high input to OR gate 56 during periods when voltage regulator 16 is to be disabled. The output of OR gate 56 is coupled to the inverting input of AND gate 40. A logic high level is first sent to the inverting input of AND gate 40 and the free input of NOR gate 44. A high level is latched at the output of NOR gate 42 while the voltage regulator 16 is still enabled because the inverting input of AND gate 40 is high. Then the signal to the inverting input of AND gate 40 and to the free input of NOR gate 44 is changed to a low logic level by the real-time clock due to the occurring of some event, consequently the voltage regulator 16 is disabled.

According to one exemplary aspect of the present invention, the other input of OR gate 38 may be coupled to a boundary-scan register chain 64 so that the voltage regulator 16 may be turned off for diagnostic purposes. Normally, this input of OR gate is held at a logic low level. If it is desired to disable voltage regulator 16 for diagnostic purposes, a logic high level is presented to this input via the boundary scan register.

According to another exemplary aspect of the present invention, bandgap reference circuit 20 has a first enable input coupled to the output of OR gate 38 to allow it to be disabled when voltage regulator 16 is disabled. A second enable input may be provided in bandgap reference circuit 20 to allow it to be separately enabled by boundary scan register chain 64 for diagnostic purposes.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A power-up and power-down circuit for use on an integrated circuit having circuits using a first power-supply voltage and a second power-supply voltage comprising:
   a first I/O pad;
   a second I/O pad;
   a third I/O pad;
   a fourth I/O pad;
   a fifth I/O pad coupled to circuits in the integrated circuit that use the second voltage;
   a bandgap reference;

a voltage regulator set for the first voltage, having an input coupled to the first I/O pad and to circuits in the integrated circuit that use the second voltage, an output coupled to the second I/O pad, a reference input of the internal voltage regulator coupled to the bandgap reference, a first-voltage feedback input coupled to the third I/O pad, and an enable input;

logic circuitry coupled to the fourth I/O pad and configured to drive the enable input of the voltage regulator in response to logic signals from the fifth I/O pad; and a transistor having a first terminal coupled to the first I/O pad, a gate coupled to the second I/O pad, and a second terminal coupled to the third I/O pad.

2. The power-up and power-down circuit of claim 1 further including:

a real-time clock powered by the second voltage; and wherein the logic circuitry is coupled to the real-time clock and the fourth I/O pad, and is configured to drive the enable input of the voltage regulator in response to logic signals from at least one of the real-time clock and the fourth I/O pad.

3. The power-up and power-down circuit of claim 1 further including:

programmable logic; and wherein the logic circuitry is coupled to the programmable logic and the fourth I/O pad, and is configured to drive the enable input of the voltage regulator in response to logic signals from at least one of the programmable logic and the fourth I/O pad.

4. The power-up and power-down circuit of claim 3 wherein:

the programmable logic is powered by the first voltage.

5. The power-up and power-down circuit of claim 1 wherein:

the transistor is an external NPN transistor connected as an emitter follower with the first terminal the collector, the gate the base, and the second terminal the emitter.

6. The power-up and power-down circuit of claim 5 which further comprises:

a filter capacitor coupled between the second terminal of the transistor and ground.

\* \* \* \* \*